United States Patent
Lei et al.

(10) Patent No.: US 8,748,306 B2
(45) Date of Patent: Jun. 10, 2014

(54) CLEANING RESIDUAL MOLDING COMPOUND ON SOLDER BUMPS

(75) Inventors: Yi-Yang Lei, Wuqi Township, Taichung County (TW); Hung-Jui Kuo, Hsinchu (TW); Chung-Shi Liu, Hsinchu (TW); Mirng-Ji Lii, Sinpu Township, Hsinchu County (TW); Chen-Hua Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 340 days.

(21) Appl. No.: 13/198,767

(22) Filed: Aug. 5, 2011

(65) Prior Publication Data

US 2013/0034956 A1 Feb. 7, 2013

(51) Int. Cl.
*H01L 21/44* (2006.01)
*H01L 23/22* (2006.01)
*H01L 23/48* (2006.01)

(52) U.S. Cl.
USPC ........... 438/612; 438/613; 438/615; 257/687; 257/738

(58) Field of Classification Search
USPC ......... 438/106–108, 612–615, 678, 687, 688, 438/734, 737, 738; 257/678, 687, 688, 734, 257/737, 738
See application file for complete search history.

(56) References Cited

U.S. PATENT DOCUMENTS

| | | | |
|---|---|---|---|
| 6,578,755 B1 | 6/2003 | Elenius et al. | |
| 8,378,477 B2 * | 2/2013 | Do et al. | 257/686 |
| 8,471,154 B1 * | 6/2013 | Yoshida et al. | 174/260 |
| 2005/0070083 A1 | 3/2005 | Johnson et al. | |
| 2007/0134849 A1 * | 6/2007 | Vanfleteren et al. | 438/123 |

* cited by examiner

*Primary Examiner* — Hsien Ming Lee
(74) *Attorney, Agent, or Firm* — Duane Morris LLP

(57) ABSTRACT

A method of forming wafer-level chip scale packaging solder bumps on a wafer substrate involves cleaning the surface of the solder bumps using a laser to remove any residual molding compound from the surface of the solder bumps after the solder bumps are reflowed and a liquid molding compound is applied and cured.

11 Claims, 2 Drawing Sheets

CLEANING RESIDUAL MOLDING COMPOUND ON SOLDER BUMPS

FIELD

The disclosed subject matter generally relates to packaging technologies.

BACKGROUND

In some integrated circuit (IC) devices that employ wafer level chip scale packaging (WLCSP), liquid molding compound is applied to the WLCSP solder bump side of the IC devices and cured to improve the reliability of the solder bumps in the field. The cured molding compound surrounding the WLCSP solder bumps provide similar role as underfill, which are generally applied after the IC devices are diced and mounted onto a next level substrate, and eliminated the need for underfill in many device packages. After the liquid molding compound is cured, some amount of extraneous cured molding compound are present on the surface of the solder bumps. However, because the solder bumps are subsequently mounted to a next level substrate, any extraneous cured molding compound that are present on the surface of the WLCSP solder bumps are cleaned using wet chemical cleaning process or plasma cleaning process. The wet chemical cleaning processes tend to be costly and they often leave behind some residual cured molding compound which results in solder hump wettability defects when the IC devices are diced and subsequently mounted onto a substrate.

DETAILED DESCRIPTION

Figure 1:
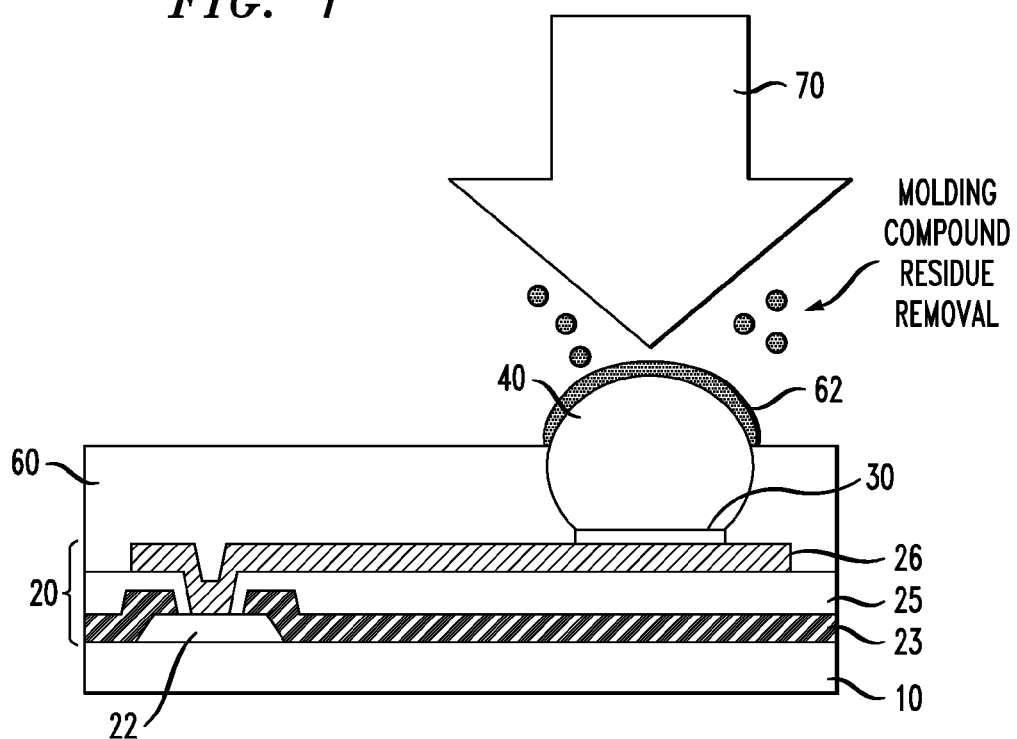
FIG. 1 is a schematic illustration of an exemplary structure showing an implementation of the solder bump cleaning process according to the present disclosure.

This description of the exemplary embodiments is intended to be read in connection with the accompanying drawings, which are to be considered part of the entire written description, In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 2:
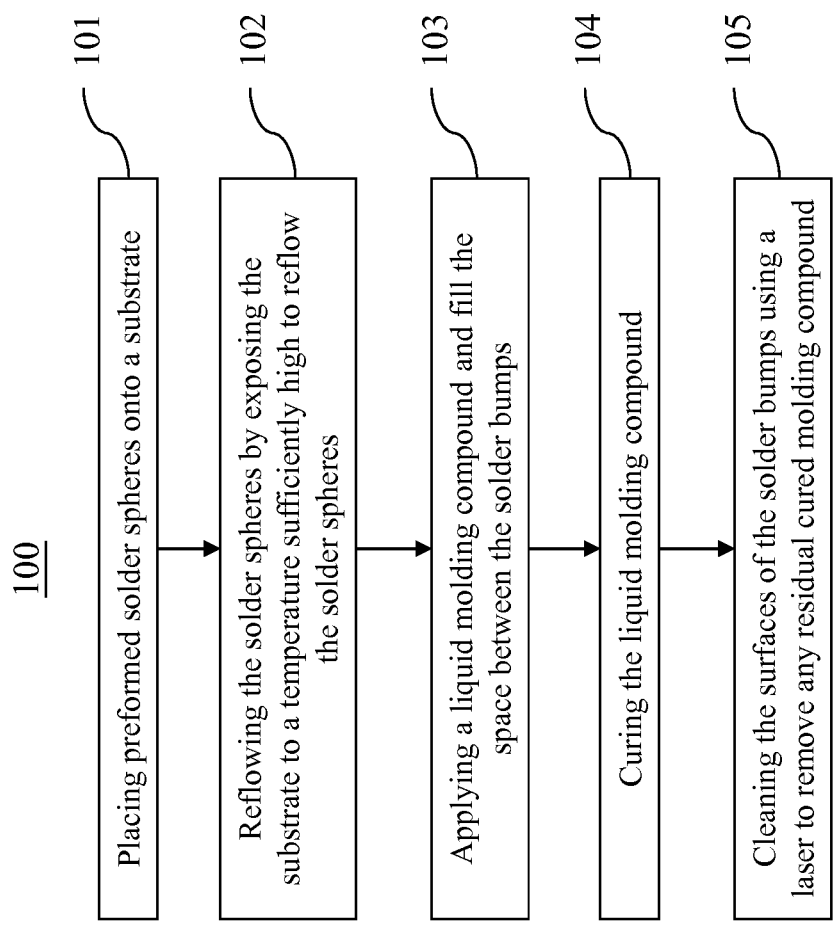
FIG. 2 is a flow chart of the forming process including a solder bump cleaning process according to an embodiment of the present disclosure.

A method of forming solder bumps according to an implementation of the present disclosure will be described with references to FIGS. 1 and 2. FIG. 1 shows across-sectional view through a portion of a substrate 10. In one embodiment, the substrate 10 is a semiconductor substrate, such as a silicon wafer, a silicon die, a semiconductor-on-insulator (SOI) substrate, or any construction comprising semiconductor materials. In some embodiments, the substrate 10 is a device substrate that includes the IC circuits or semiconductor devices such as transistors, capacitors, resistors, diodes, photo-diodes, fuses, and the like, interconnected to perform one or more functions may be formed at the surface of semiconductor substrate. The IC circuits and semiconductor devices are not shown in this illustration.

On the substrate 10 are wiring layers 20 that provides an array of a plurality of under hump metallurgy (UBM) pads 30 (one example shown) for forming solder bumps 40 thereon. In one embodiment, the wiring layers 20 include a passivation layer 23, a polymer layer 25 and redistribution metal wiring feature(s) 26 that connect certain bond pads 22 on the substrate 10 to the UBM pads 30.

The UBM pads 30 have a metal composition suitable for desired wetting of a solder bump 40 thereon. In many devices, the UBM pads 30 are formed of a thin film of Ni. In some embodiments, the UBM pad 30 includes a diffusion barrier layer and/or a seed layer. The diffusion barrier layer may be formed of tantalum nitride, although it may also be formed of other materials such as titanium nitride, tantalum, titanium, or the like. The seed layer may be a copper seed layer formed on the diffusion barrier layer. The seed layer may be formed of copper alloys that include silver, chromium, nickel, tin, gold, and combinations thereof.

In one embodiment, the passivation layer 23 is formed of a non-organic material selected from un-doped silicate glass (USG), silicon nitride, silicon oxynitride, silicon oxide, and combinations thereof. In another embodiment, the passivation layer 23 is formed of a polymer layer, such as an epoxy, polyimide, benzocyclobutene (BCB), polybenzoxazole (PBO), and the like. The redistribution metal wiring feature (s) 26 may be formed of a conductive material including, but not limited to, for example copper, aluminum, copper alloy, nickel, or other mobile conductive materials. The polymer layer 25 may be formed of an epoxy, polyimide, benzocyclobutene (BCB), polybenzoxazole (PBO), and the like, although other relatively soft, often organic, dielectric materials can also be used.

In FIG. 1, the solder bump 40 was formed by placing a preformed solder sphere onto the UBM pad 30 and then reflowing the solder sphere. The solder bump may include a lead-free pre-solder layer, SnAg, or a solder material including alloys of tin, lead, silver, copper, nickel, bismuth, or combinations thereof. Reflowing melts the solder sphere allowing it to wet and adhere to the UBM pad 30 and forming a. desired bump configuration. After the solder reflow process, a liquid molding compound 60 is applied and cured. After the cure process, often, there may be some residual cured liquid compound 62 on the surface of the solder bump 40. According to the present disclosure, the residual cured liquid molding compound 62 is effectively removed by cleaning the surface of the solder bump 40 using a laser beam 70 to burn off the residual molding compound. The liquid molding compounds are polymer type material and typically epoxy resin type materials are used. The inventors have found that the laser cleaning effectively removes all types of liquid molding compounds currently in use in the industry. In one implementation of the present disclosure, the cleaning process is accomplished using a UV laser.

Referring to the flow chart 100 in FIG. 2 a method of forming wafer-level chip scale packaging solder bumps on a substrate according to an implementation of the present disclosure will be described. The method comprises placing preformed solder spheres onto the substrate by aligning the preformed solder spheres with UBM pads on the substrate. (See box 101). After the preformed solder spheres are placed onto the UBM pads, the solder spheres are reflowed. by exposing the whole substrate to a temperature sufficiently high to reflow the solder spheres. (See box 102). Upon reflow, the solder spheres form into solder bumps. The particular reflow temperature will depend largely on the particular alloy composition of the solder spheres, Reflow processes for solder spheres of various alloy compositions are well known in the art and need not be described here. Next, a liquid molding compound is applied to fill the space between the solder bumps and then cured. (See boxes 103 and 104). The cured molding compound serves similar function as the under-fill used in flip-chip chip-level packaging or ball grid array (BGA) packages and enhances the reliability of the wafer-level CSP interconnection of the devices. After curing the liquid molding compound, the surfaces of the solder bumps are cleaned using a laser to remove any residual cured molding compound from the surfaces of the solder bumps. (See box 105). This laser cleaning of the solder bumps is conducted with a UV laser.

In one implementation, the UV laser having a wavelength in the range of 100 nm -400 and energy level in the range of 300-1500 mJ/cm$^2$ is used. The beam size of the UV laser is in the range of 1 mm×1 mm-50 mm×50 mm, According to another implementation of the present disclosure, the cleaning step is conducted with a UV laser whose energy level is in the range of 400-1400 mJ/cm$^2$.

Although the subject matter has been described in terms of exemplary embodiments, it is not limited thereto. Rather, the appended claims should be construed broadly, to include other variants and embodiments, which may be made by those skilled in the art.

What is claimed is:

1. A method of forming solder bumps on a substrate comprising:

placing solder spheres onto the wafer substrate;
   reflowing the solder spheres whereby each of the solder spheres form a solder bump on the wafer substrate;
   applying a liquid molding compound on the wafer substrate between the solder bumps without completely covering the solder bumps, whereby a portion of each of the solder bump's surface is exposed;
   curing the liquid molding compound; and
   cleaning the exposed surface of the solder bumps using a laser to remove residual molding compound from the exposed surface of the solder bumps.

2. The method of claim 1, wherein the cleaning step is conducted with a UV laser.

3. The method of claim 2, wherein the UV laser energy level is in the range of 300-1500 mJ/cm$^2$.

4. The method of claim 3, wherein the UV laser beam size is in the range of 1 mm×1 mm -50 mm×50 mm.

5. The method of claim 2, wherein the UV laser energy level is in the range of 400 -1400 mJ/cm$^2$.

6. The method of claim 2, wherein the UV laser beam size is in the range of 1 mm×1 mm -50 mm×50 mm.

7. The method of claim 1, wherein the cleaning step is conducted with a UV laser whose wavelength is in the range of 100 nm -400 nm.

8. The method of claim 7, wherein the UV laser energy level is in the range of 300 -1500 mJ/cm$^2$.

9. The method of claim 8, wherein the UV laser beam size is in the range of 1 mm×1 mm -50 mm×50 mm.

10. The method of claim 7, wherein the UV laser energy level is in the range of 400-1400 mJ/cm$^2$.

11. The method of claim 10, wherein the UV laser beam size is in the range of 1 mm ×1 mm -50 mm×50 mm.

\* \* \* \* \*